United States Patent [19]
Jefferson et al.

[11] Patent Number: 5,744,991
[45] Date of Patent: Apr. 28, 1998

[54] SYSTEM FOR DISTRIBUTING CLOCKS USING A DELAY LOCK LOOP IN A PROGRAMMABLE LOGIC CIRCUIT

[75] Inventors: David E. Jefferson, San Jose, Calif.; L. Todd Cope, Penang, Malaysia; Srinivas Reddy, Santa Clara; Richard G. Cliff, Milpitas, both of Calif.

[73] Assignee: Altera Corporation, San Jose, Calif.

[21] Appl. No.: 543,420

[22] Filed: Oct. 16, 1995

[51] Int. Cl.⁶ .............................. H03L 7/08; H03L 7/087
[52] U.S. Cl. .......................... 327/158; 327/147; 327/149; 327/156; 327/12; 331/11
[58] Field of Search .................... 327/147, 149, 327/150–153, 156, 158–161, 233, 234, 236, 244, 245, 261; 331/10–12

[56] References Cited

U.S. PATENT DOCUMENTS

| | | | |
|---|---|---|---|
| 4,604,582 | 8/1986 | Strenkowski et al. | 327/147 |
| 4,609,986 | 9/1986 | Hartmann et al. | 364/200 |
| 4,617,479 | 10/1986 | Hartmann et al. | 307/465 |
| 4,637,018 | 1/1987 | Flora et al. | 327/152 |
| 4,677,318 | 6/1987 | Veenstra et al. | 307/465 |
| 4,689,581 | 8/1987 | Talbot | 331/1 |
| 4,713,792 | 12/1987 | Hartmann et al. | 364/900 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,079,519 | 1/1992 | Ashby et al. | 327/231 |
| 5,118,975 | 6/1992 | Hillis et al. | 327/244 |
| 5,121,006 | 6/1992 | Pedersen et al. | 307/465 |
| 5,173,617 | 12/1992 | Alsup et al. | 327/158 |
| 5,204,555 | 4/1993 | Graham et al. | 307/465 |
| 5,223,755 | 6/1993 | Richley | 327/158 |
| 5,241,224 | 8/1993 | Pedersen et al. | 307/465 |
| 5,260,608 | 11/1993 | Marbot | 327/261 |
| 5,260,610 | 11/1993 | Pedersen et al. | 307/465 |
| 5,260,611 | 11/1993 | Cliff et al. | 307/465 |
| 5,298,866 | 3/1994 | Kaplinsky | 327/261 |
| 5,350,954 | 9/1994 | Patel et al. | 307/465 |
| 5,355,037 | 10/1994 | Andresen et al. | 327/158 |
| 5,537,069 | 7/1996 | Volk | 327/149 |
| 5,544,203 | 8/1996 | Casascute et al. | 327/149 |
| B1 4,617,479 | 9/1993 | Hartmann et al. | 307/465 |

OTHER PUBLICATIONS

Dr. Dao–Long Chen, "Designing On–Chip Clock Generators," Circuits and Devices, Jul. 1992, pp. 32–36.

Mark G. Johnson, Edwin L. Hudson, "A Variable Delay Line PLL for CPU–Coprocessor Synchronization," IEEE Journal of Solid State Circuits, vol. 23 No. 5, pp. 1218–1223.

Ian A. Young, Jeffrey K. Greason, Keng L. Wong, "A PLL Clock Generator with 5 to 110 MHz of Lock Range for Microprocessors," IEEE Journal of Solid State Circuits, vol. 27, No. 11, Nov. 1992, pp. 1599–1607.

Uming Ko, Shannon A Wichman, Shawn Castrianni, "A 30–ps Jitter, 3.6–us Locking 3.3–Volt Digital PLL for CMOS Gate Arrays," IEEE 1993 Custom Integrated Circuits Conference, pp. 23.3.1–23.3.4.

Florence Lee, "PLL Application Note," LSI Logic Corporation, Nov. 8, 1991, pp. 1–28.

*Primary Examiner*—Timothy P. Callahan
*Assistant Examiner*—T. T. Lam
*Attorney, Agent, or Firm*—Townsend and Townsend and Crew LLP

[57] ABSTRACT

A system (100) for distributing a clock signal to many points on an integrated circuit. The system includes using a delay lock loop with specific digital circuits to accomplish the phase error detection and delay element selection. In one embodiment, two flip-flops are used to detect a phase error. In another embodiment, both macro (202) and micro phase detectors (218) are used and the delay element selection is performed in two stages by using a shift register (210) in a first stage and a counter (220) in a second stage. Another feature of the present invention is, the ability to distribute the reference clock or a synchronized clock to different portions of the circuitry on an integrated circuit. Multiple clock distribution systems are provided which may be selected.

6 Claims, 12 Drawing Sheets

DIGITAL/ANALOG DELAY LOCK LOOP

SYSTEM FOR DISTRIBUTING CLOCKS USING A DELAY LOCK LOOP IN A PROGRAMMABLE LOGIC CIRCUIT

BACKGROUND OF THE INVENTION

This invention relates generally to clock distribution in integrated circuits and specifically to a clock distribution scheme using a delay lock loop.

As the level of integration in semiconductor integrated circuits (ICs) increases, signal delays due to parasitic resistance-capacitance loading become larger. This is especially true of high fan-out global signal lines such as synchronous clocks. Clock signals in modern programmable logic devices may drive several thousand registers. This is a considerable load to the clock driver. Clock tree structures can be implemented on-chip to minimize clock skew among registers. However, the base trunk clock driver must be capable of driving this clock tree structure and, as a result, a buffer delay of several nanoseconds is typically incurred.

One approach to clock distribution uses a phase locked loop (PLL). This approach uses a phase-locked loop to synchronize a clock distribution signal to a reference clock signal. Since the phase-locked loop generates an internal clock signal and synchronizes it to the reference clock signal from an external source, the reference clock signal does not drive the clock tree structure.

However, some problems exist with implementing a PLL in a typical integrated circuit since the PLL uses analog devices such as a phase frequency detector (PFD), charge pump and low pass filter. These problems include, among others, poor stability and performance in a noisy environment.

It is desirable to use a circuit which achieves clock distribution while minimizing the number of components, thus reducing the area on the chip used by the clock distribution circuit.

SUMMARY OF THE INVENTION

The present invention uses a delay lock loop (DLL) which can be fabricated using digital (DDLL) or analog circuitry (ADLL). The DLL achieves advantages over the PLL. Specific embodiments of a DLL further reduce the components necessary to implement the DLL. The DLL circuit of the present invention may be used in many types of integrated circuits including memories, microprocessors, ASICs, and programmable logic devices.

In one embodiment, a DLL circuit is formed on a substrate. The DLL circuit includes a reference clock input for receiving an external reference signal; a feedback clock signal derived from the reference clock signal; a digital phase detector coupled to the reference clock signal and the feedback clock signal, wherein the digital phase detector determines the phase difference between the reference clock signal and the feedback clock signal and outputs a phase error signal at a phase error signal output.

The embodiment further includes a delay selector coupled to the phase error signal and the reference clock signal in response to the phase error signal, wherein the delay selector outputs the delayed reference clock signal as the feedback clock signal. A synchronized clock output is coupled to the feedback clock signal for outputting the synchronized clock.

Another embodiment of a DLL circuit includes a reference clock input for receiving an external reference clock signal; a feedback clock signal derived from the reference clock signal; a macro phase detector coupled to the reference clock signal and the delayed feedback signal, wherein the macro phase detector outputs a macro phase error signal indicating the phase difference between the reference clock signal and the delayed feedback signal, and wherein the macro phase error signal indicates phase differences of at least a first amount.

The second embodiment further includes a micro phase detector coupled to the reference clock signal and the delayed feedback signal, wherein the micro phase detector outputs a micro phase error signal indicating the phase difference between the reference clock signal and the delayed feedback signal. The micro phase error signal indicates phase differences of at least a second amount, wherein the second amount is smaller than the first amount.

A micro delay selector responsive to the macro phase error signal is also included for outputting a delayed reference clock signal. The circuit further includes a micro delay selector coupled to the output of a micro delay selector, wherein the micro delay selector outputs a further delayed reference clock signal; and a synchronized clock signal derived from the further delayed reference clock signal.

Other objects, features, and advantages of the present invention will become apparent upon consideration of the following detailed description and the accompanying drawings, in which like reference designations represent like features throughout the figures.

DESCRIPTION OF THE PREFERRED EMBODIMENT

Figure 1A:
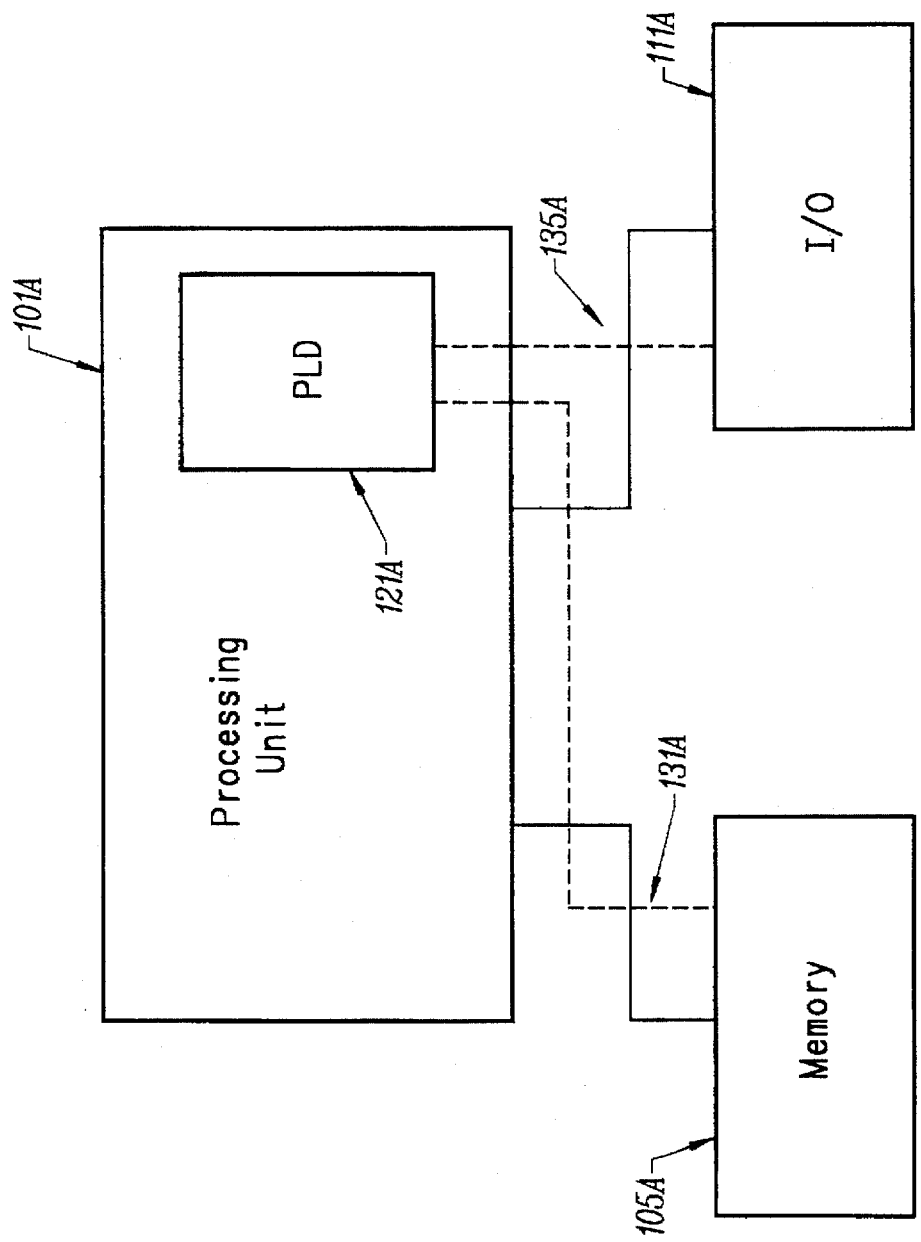
FIG. 1A is a block diagram of a digital system incorporating a programmable logic device integrated circuit.

FIG. 1A shows a block diagram of a digital system within which the present invention may be embodied. In the particular embodiment of FIG. 1A, a processing unit 101A is coupled to a memory 105a and an I/O 111A and incorporates a programmable logic device (PLD) 121A. PLD 121A may be specially coupled to memory 105A through connection 131A and to I/O 111A through connection 135A.

The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121A, or a combination of a general purpose computer and auxiliary special purpose hardware.

Processing unit 101A may direct data to an appropriate system component for processing or storage, execute a program stored in memory 105A or input using I/O 111A, or other similar function. Processing unit 101A may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121A may control the logical operations of the system.

In some embodiments, processing unit 101A may even be a computer system. In one embodiment, source code may be stored in memory 105A, compiled into machine language, and executed by processing unit 101A. Processing unit 101A need not contain a CPU and in one embodiment, instructions may be executed by one or more PLDs 121A. Instead of storing source code in memory 105A, only the machine language representation of the source code, without the source code, may be stored in memory 105A for execution by processing unit 101A. Memory 105A may be a random access memory (RAM), read only memory (ROM), fixed or flexible disk media, PC Card flash disk memory, tape, or any other storage retrieval means, or any combination of these storage retrieval means.

Processing unit 101A uses I/O 111A to provide an input and output path for user interaction. For example, a user may input logical functions to be programmed into programmable logic device 121A. I/O 111A may be a keyboard, mouse, track ball, digitizing tablet, text or graphical display, touch screen, pen tablet, printer, or other input or output means, or any combination of these means. In one embodiment, I/O 111A includes a printer used for printing a hard copy of any processing unit 101A output. In particular, using I/O 111A, a user may print a copy of a document prepared using a word processing program executed using processing unit 101A. In other cases, a user may print out a copy of the source code or a listing of the logical functions contained within PLD 121A.

PLD 121A may serve many different purposes within the system in FIG. 1A. PLD 121A may be a logical building block of processing unit 101A, supporting its internal and external operations. PLD 121A is programmed to implement the logical functions necessary to carry on its particular role in system operation.

Figure 1B:
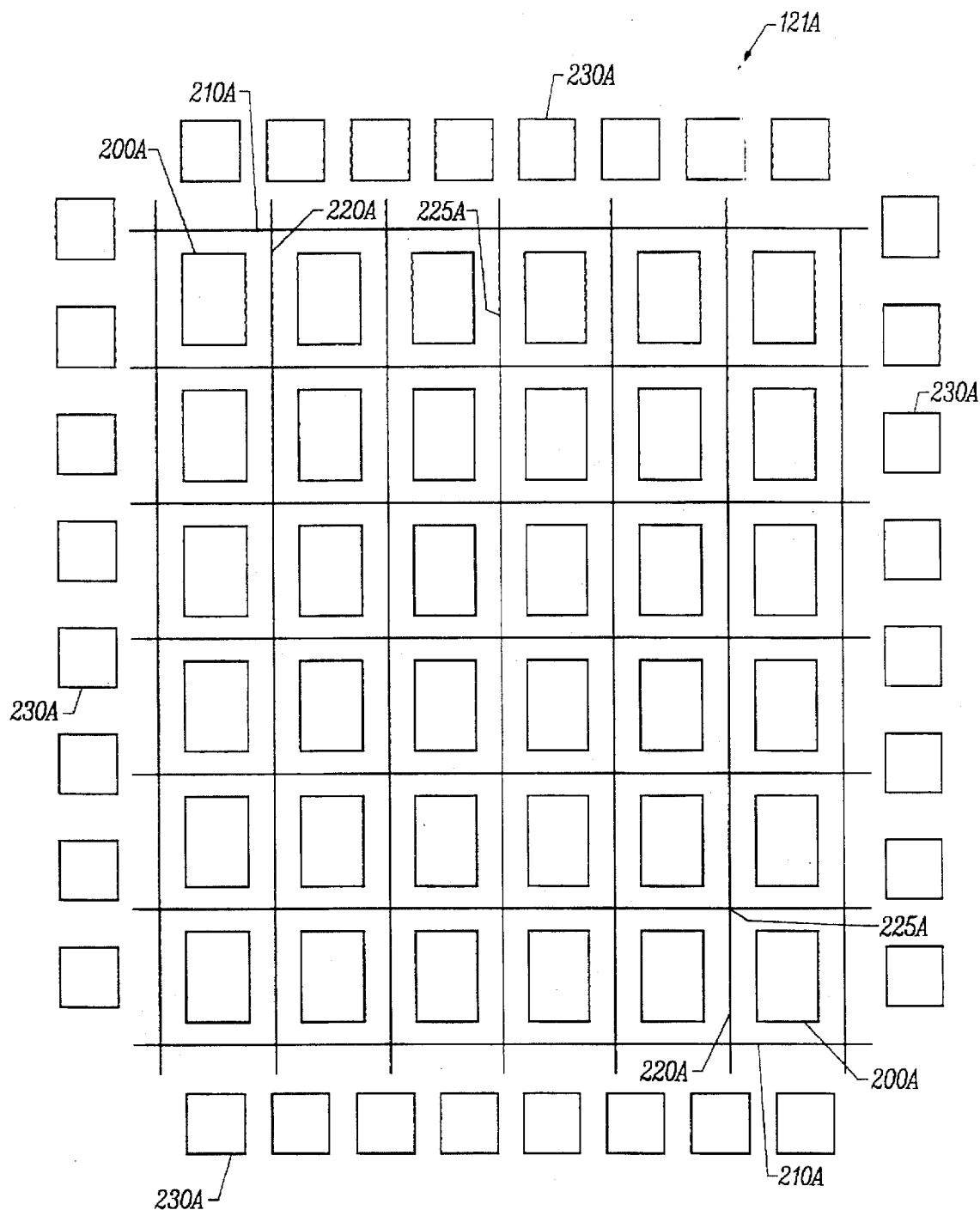
FIG. 1B is a block diagram showing the overall architecture of a programmable logic device.

FIG. 1B is a simplified block diagram of the overall internal architecture and organization of PLD 121A of FIG. 1A. Many details of PLD architecture, organization, and circuit design are not necessary for an understanding of the present invention and such details are not shown in FIG. 1B.

FIG. 1B shows a six-by-six two-dimensional array of thirty-six logic array blocks (LABs) 200A. LAB 200A is a physically grouped set of logical resources that is configured or programmed to perform logical functions. The internal architecture of a LAB will be described in more detail below in connection with FIG. 1C. PLDs may contain any arbitrary number of LABs, more or less than the PLD 121A shown in FIG. 1B. Generally, in the future, as technology advances and improves, programmable logic devices with even greater numbers of logic array blocks will undoubtedly be created. Furthermore, LABs 200A need not be organized in a square matrix; for example, the array may be organized in a five-by-seven or a twenty-by-seventy matrix of LABs.

LAB 200A has inputs and outputs (not shown) which may or may not be programmably connected to a global interconnect structure, comprising an array of global horizontal interconnects (GHs) 210A and global vertical interconnects (GVs) 220A. Although shown as single lines in FIG. 1B, each GH 210A and GV 220A line represents a plurality of signal conductors. The inputs and outputs of LAB 200A are programmably connectable to an adjacent GH 210A and an adjacent GV 220A. Utilizing GH 210A and GV 220A interconnects, multiple LABs 200A may be connected and combined to implement larger, more complex logic functions than can be realized using a single LAB 200A.

In one embodiment, GH 210A and GV 220A conductors may or may not be programmably connectable at intersections 225A of these conductors. Moreover, GH 210A and GV 220A conductors may make multiple connections to other GH 210A and GV 220A conductors. Various GH 210A and GV 220A conductors may be programmably connected together to create a signal path from a LAB 200A at one location on PLD 121A to another LAB 200A at another location on PLD 121A. Furthermore, an output signal from one LAB 200A can be directed into the inputs of one or more LABs 200A. Also, using the global interconnect, signals from a LAB 200A can be fed back into the same LAB 200A. In other embodiments or the present invention, only selected GH 210A conductors are programmably connectable to a selection of GV 220A conductors. Furthermore, in still further embodiments, GH 210A and GV 220A conductors may be specifically used for passing signal in a specific direction, such as input or output, but not both.

The PLD architecture in FIG. 1B further shows at the peripheries of the chip, input-output drivers 230A. Input-output drivers 230A are for interfacing the PLD to external, off-chip circuitry. FIG. 1B shows thirty-two input-output drivers 230A; however, a PLD may contain any number of input-output drivers, more or less than the number depicted. Each input-output driver 230A is configurable for use as an input driver, output driver, or bidirectional driver.

Figure 1C:
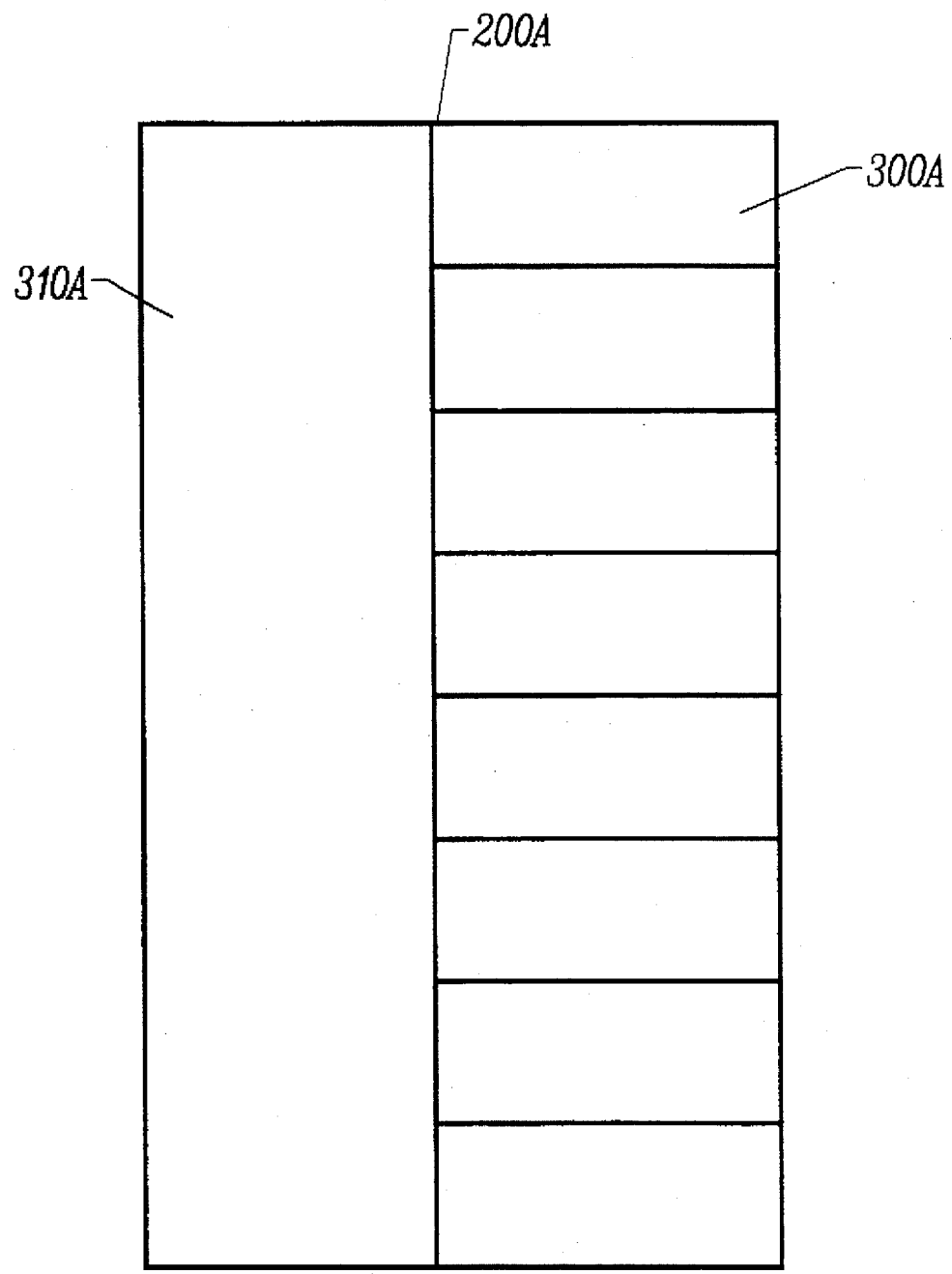
FIG. 1C is a simplified block diagram of a logic array block (LAB) of a programmable logic device.

FIG. 1C shows a simplified block diagram of LAB 200A of FIG. 1B. LAB 200A is comprised of a varying number of logic elements (LEs) 300A, sometimes referred to as "logic cells," and a local (or internal) interconnect structure 310A. LAB 200A has eight LEs 300A, but LAB 200A may have any number of LEs, more or less than eight. In a further embodiment of the present invention, LAB 200A has two "banks" of eight LEs for a total of sixteen LEs, where each bank has separate inputs, outputs, control signals, and carry chains.

A general overview of LE 300A is presented here, sufficient to provide a basic understanding of the present invention. LE 300A is the smallest logical building block of a PLD. Signals external to the LAB, such as from GHs 210A and GVs 220A, are programmably connected to LE 300A through local interconnect structure 310A, although LE 300A may be implemented in many architectures other than those shown in FIGS. 1A–C. In one embodiment, LE 300A of the present invention incorporates a function generator that is configurable to provide a logical function of a number of variables, such a four-variable Boolean operation. As well as combinatorial functions, LE 300A also provides support for sequential and registered functions using, for example, D flip-flops.

LE 300A provides combinatorial and registered outputs that are connectable to the GHs 210A and GVs 220A, outside LAB 200A. Furthermore, the outputs from LE 300A may be internally fed back into local interconnect structure 310A; through local interconnect structure 310A, an output from one LE 300A may be programmably connected to the inputs of other LEs 300A, without using the global interconnect structure's GHs 210A and GVs 220A. Local interconnect structure 310A allows short-distance interconnection of LEs, without utilizing the limited global resources, GHs 210A and GVs 220A. Through local interconnect structure 310A and local feedback, LEs 300A are programmably connectable to form larger, more complex logical functions than can be realized using a single LE 300A. Furthermore, because of its reduced size and shorter length, local interconnect structure 310A has reduced parasitics compared to the global interconnection structure. Consequently, local interconnect structure 310A generally allows signals to propagate faster than through the global interconnect structure.

The present invention may be used in various places in many types of integrated circuits, including a PLD as described above. For example, in a PLD, the present invention may be used to drive a clock signal throughout the PLD components, with minimal clock skew between the components. In one embodiment of the present invention, there is no clock skew between the components. A clock generated using the techniques of the present invention may be routed to the look-up tables, sequential machines, registers, function generators, programmable interconnect, multiplexers, I/Os and other components of the PLD.

Figure 1D:
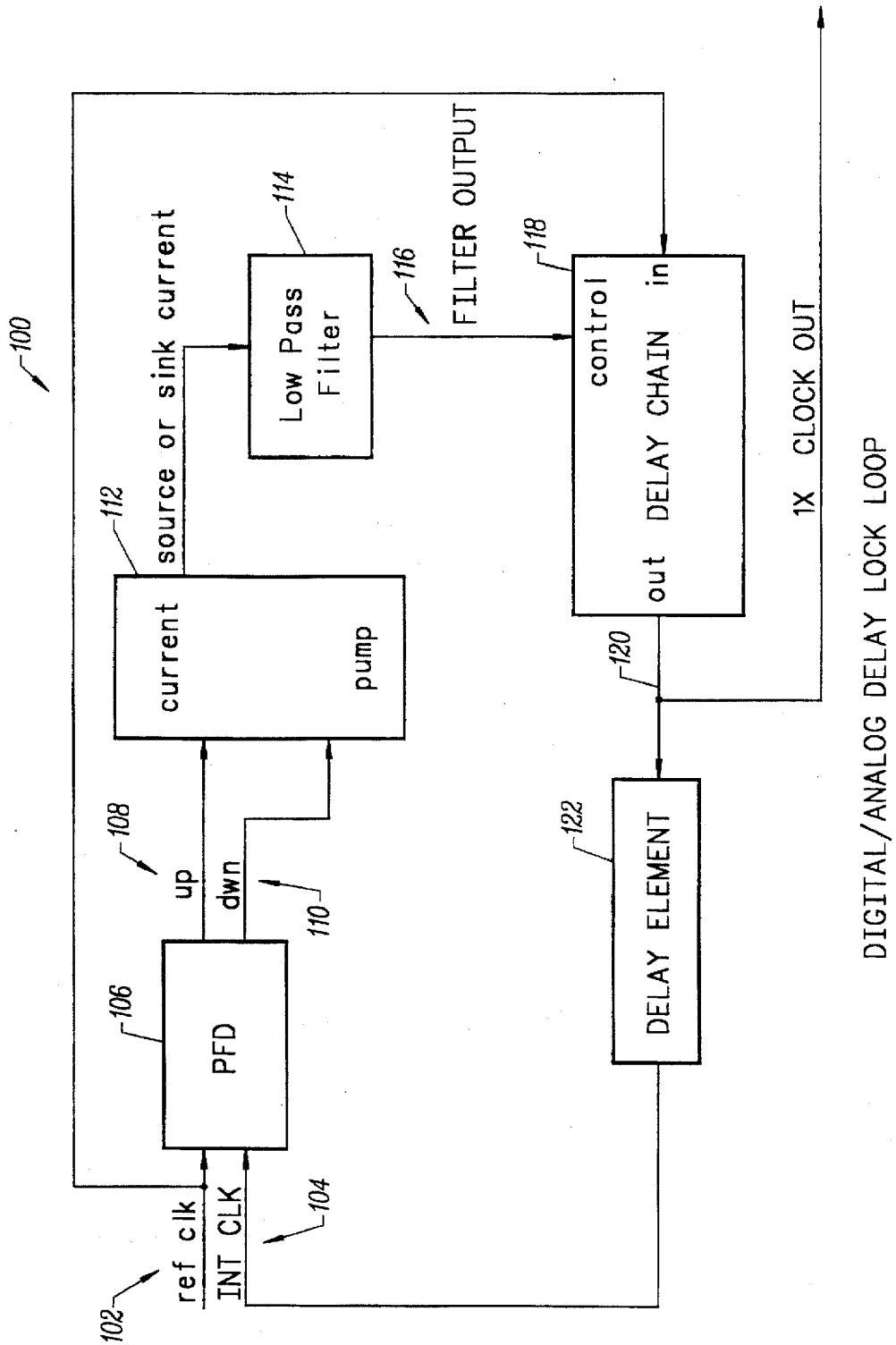
FIG. 1D shows the basic functional blocks in a digital or analog delay lock loop circuit of the present invention.

FIG. 1D shows the basic functional blocks in a DLL circuit 100, which may be embodied in the digital system of FIG. 1A. The circuit may be digital, analog or a combination of both. In FIG. 1D, a reference clock 102 is provided from a source external to circuit 100. Reference clock 102 is input along with an internal, or "feedback" clock 104, to PFD 106. PFD 106 outputs signals UP 108 and DWN 110 which are input to current pump 112. PFD 106 detects frequency and phase differences between reference clock 102 and internal clock 104.

Figure 2:
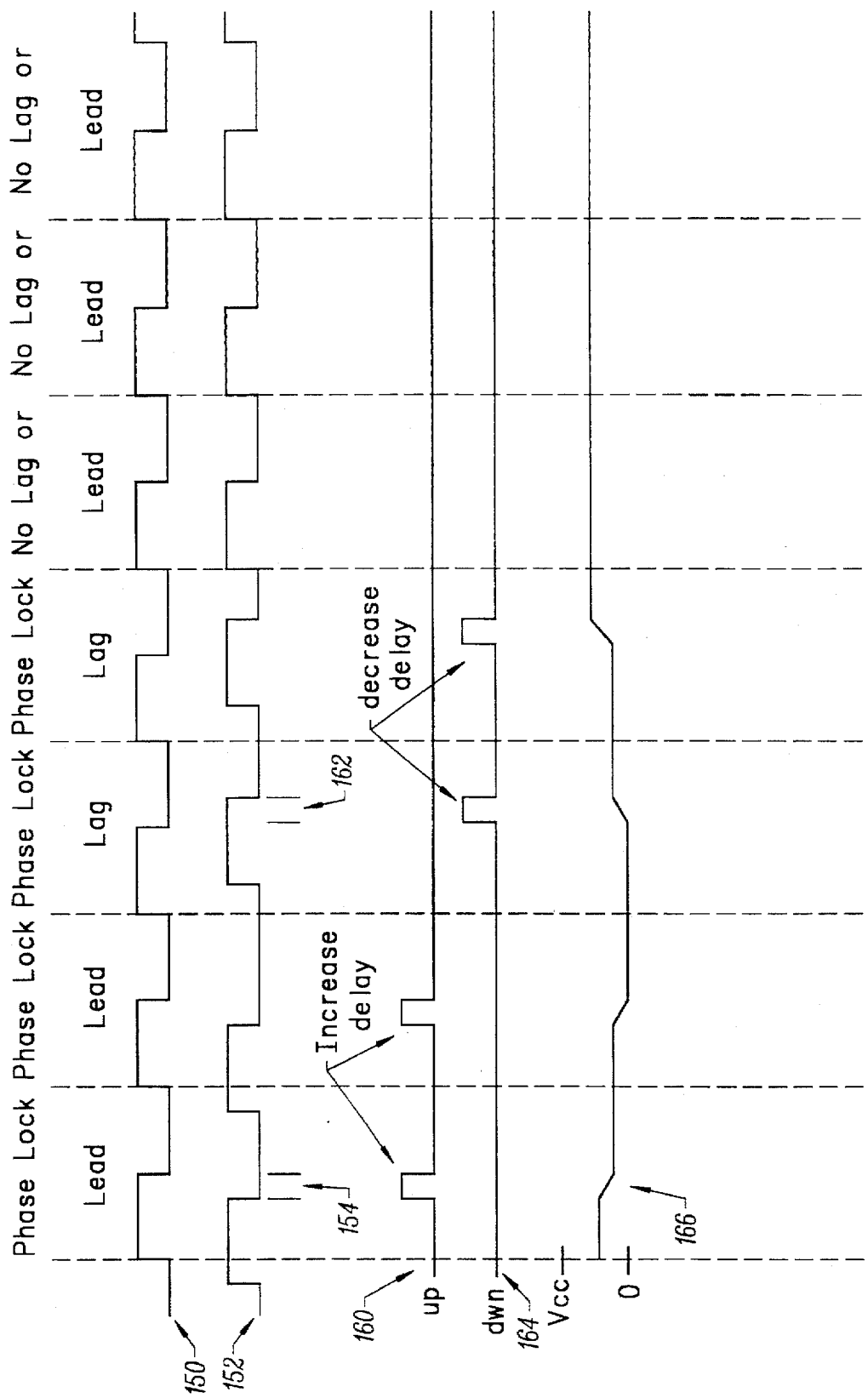
FIG. 2 shows a timing diagram of the signals in the circuit of FIG. 1D.

FIG. 2 shows a timing diagram of signals in the DLL circuit 100 of FIG. 1D. In FIG. 2, reference clock 102 is shown as waveform 150, while internal clock 104 is shown as waveform 152. The phase difference between reference clock waveform 150 and internal clock waveform 152 is shown, for example, at 154. Because internal clock waveform 152, rises from low to high, before reference clock waveform 150, the internal clock signal is said to "lead" the reference clock signal.

The amount of lead in the internal clock waveform 152 is used to generate a signal on UP signal 108. Signal 108 is in the form of a square wave having a duration of the same interval as the lead time between clock waveforms 150 and 152. Signal 108 is shown at 160 in the timing diagram of FIG. 2. Similarly, the case where the internal clock waveform 152 "lags," the reference clock waveform 150 is shown at 162. In this case, PFD 106 outputs a signal on the DWN signal line to produce a square wave with a duration equivalent to the amount of lag between the clock waveforms. DWN signal 110 is shown at 164 in the timing diagram of FIG. 2.

Returning to FIG. 1D, the UP and DWN signals 108 and 110 respectively, are input to current pump 112. Current pump 112 sends a charge to low pass filter 114 corresponding to signals 108 and 110 from PFD 106. The output of low pass filter 114 is an analog voltage level as shown by waveform 166 of FIG. 2. This analog signal output by low pass filter 114 is shown as signal 116 in FIG. 1D. Signal 116 is fed to delay chain 118 to control the amount of delay applied to the reference clock signal. The delayed reference clock signal is output at 120 to delay element 122. The output 120 is also the clock output distributed to components on the integrated circuit in which the digital/analog DLL of FIG. 1D is acting as the clock distribution circuit. Delay element 122 serves to further delay the already delayed reference clock signal from delay chain 118. This further delay compensates for internal delays across a chip on which the circuit is fabricated. By matching all of the delays on the chip the DLL can compensate for the worst case delay. The output of delay element 122 is used as the input to PFD 106.

The method of distributing the clock throughout the integrated circuit may include programmable delay elements. For example, the clock output may be distributed to components of an integrated circuit through a plurality of programmable delay elements. These programmable delay elements may be programmed to provide a uniform delay for the synchronized clock throughout the integrated circuit. For example, for a component a longer distance away from the clock generator, a longer programmable delay may be used that for a component closer to the clock generator. Programmable delays may be used in this way to equalize the delay and skew of the clock signal at the various components, regardless of their distance from the clock generator. In a preferred embodiment, the programmable delay elements may be programmable metal elements, providing an RC delay. Similarly, delay chain 118 and delay element 122 may be implemented using programmable delay elements.

There are many benefits due to clock synthesis. For example, on many integrated circuits, a clock signal is routed long distances from the clock source. The present invention permits these long runs of a clock signal line, and minimizes the clock skew between the signal lines. A zero nanoseconds clock skew may be obtained with the present invention. By minimizing the skew between the clock lines, this may improve, for example, the setup and hold times for components, functional blocks and I/Os on the integrated circuit.

There are many ways of implementing the functional blocks of FIG. 1D. Next, some of the possible implementations are discussed as preferred embodiments.

Figure 3A:
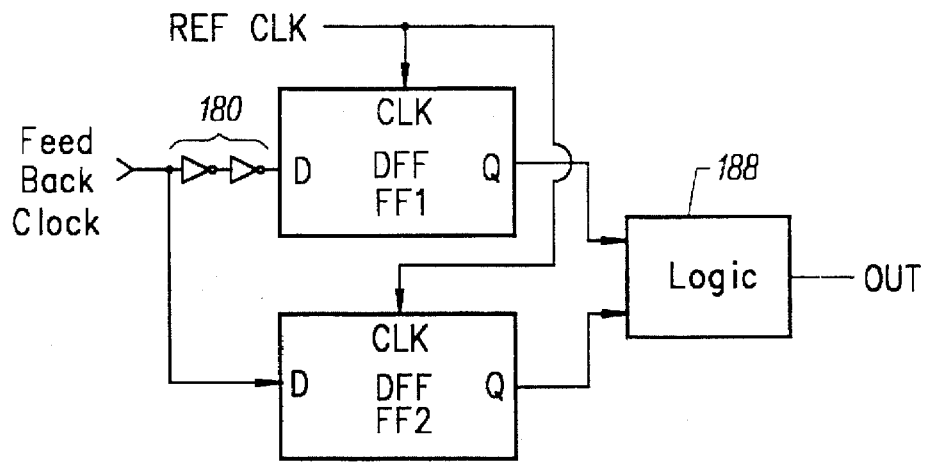
FIG. 3A is a diagram of a circuit for achieving a phase frequency detector function.

FIG. 3A is a diagram of a circuit for achieving the PFD function shown in FIG. 1D's PFD 106. FIG. 3A shows a digital approach to implementing a PFD. The circuit of 3A is only a phase detector, since it is incapable of detecting frequency errors, as discussed below. An advantage to using the digital phase-only circuit detector of FIG. 3A is that the space required to fabricate the circuit on a silicon substrate is small. Also, the circuit of FIG. 3A uses standard digital components and is easily fabricated in an integrated circuit.

FIG. 3A shows two flip-flops, FF1 and FF2. These flip-flops are of the D-latch type as is commonly known in the art. Each flip-flop is clocked by the reference clock signal, REF CLK. The input to each flip-flop is derived from the feedback clock signal shown as the internal clock signal 104 in FIG. 1D. FF1 receives a delayed feedback clock. The delay is due to inverters at 180. The use of two inverters is arbitrary and affects the phase error detection as discussed below. It will be apparent that any number of inverters and/or buffers may be used in place of the two inverters at 180 to create a delay for the input signal to FF1. FF2 receives the undelayed feedback clock as shown in FIG. 3A.

Figure 3B:
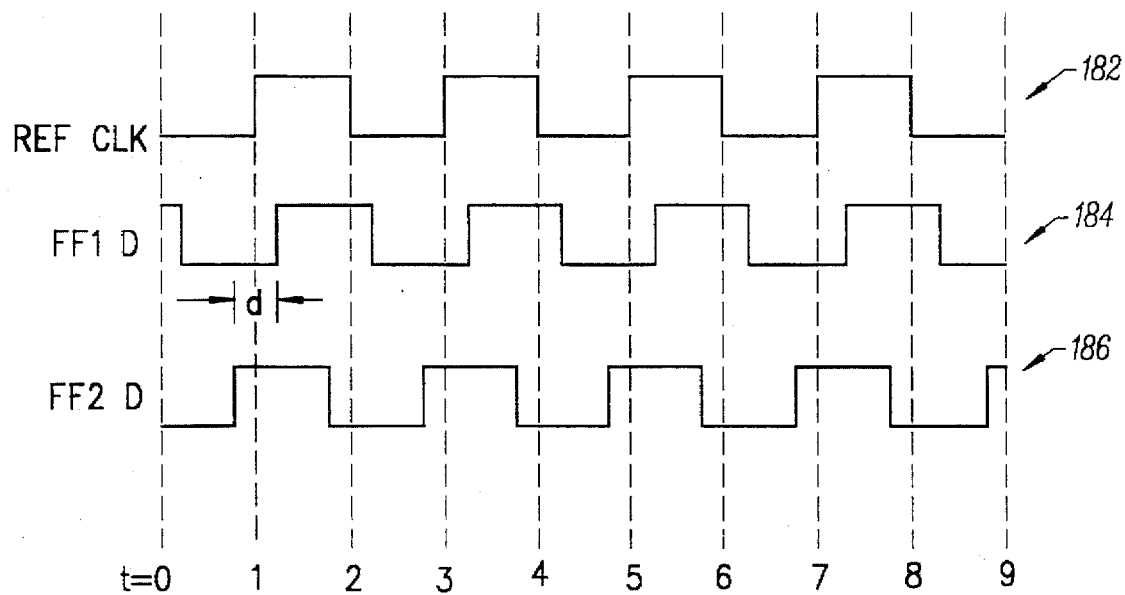
FIG. 3B is a timing diagram showing a reference clock and flip-flop input waveforms.

FIG. 3B is a timing diagram showing the reference clock signal, FF1 input signal and FF2 input signal, respectively, as waveforms 182, 184 and 186. Since the input to FF1, labelled "FF1 D", is delayed with respect to the input of FF2, there is an interval, "d," between the leading edges of each of these waveforms as shown in FIG. 3B. When the feedback clock is synchronized to the reference clock, each rising edge of the reference clock occurs between the leading edges of the FF1 and FF2 signal inputs. An example is at time t=1 in the timing diagram of FIG. 3B where the leading edge of the reference clock occurs at t=1, in between the occurrences of the leading edge of the FF2 D and FF1 D waveforms.

Combinational logic at 188 in FIG. 3A receives the outputs of FF1 and FF2 and generates a combined signal output. For example, combinational logic 188 could be a simple 2-input exclusive OR gate with the inputs to the exclusive OR gate being the outputs of each of FF1 and FF2. In this case, in normal operation when the feedback clock is synchronized to the reference clock in normal operation, the output of combinational logic 188 will be high, or a "1." This is because the outputs of FF1 and FF2 will not be the same at the leading edge of the reference clock since the reference clock goes high after FF2 has gone high and before FF1 has gone high.

However, in the case where the feedback clock is not synchronized closely to the reference clock, i.e., the phase error between the reference clock and the feedback clock is large, then the outputs of FF1 and FF2 are the same and the output of the exclusive OR gate (i.e., the output of combinational logic 188) is a low or "0" logic level.

For example, where the input to FF2 has a leading edge which does not rise until after t=1, then the reference clock leading edge samples a low signal on both the inputs to FF1 and FF2. Also, where the feedback clock is leading the reference clock sufficiently so that the leading edge of FF1 (which is delayed) occurs before t=1, the reference clock will, likewise, sample a high signal on both of the inputs to FF1 and FF2 resulting in a low logic output from combinational logic 188.

Another possibility for combinational logic 188, is to use an AND gate to output a high logic signal when the feedback clock is leading the reference clock by a sufficient margin so that high signals on both of the FF1 and FF2 inputs are sampled. A NOR gate could be used to output a logic high when the feedback clock is sufficiently lagging the reference clock so that the reference clock leading edge samples a low signal on both of the FF1 and FF2 inputs. In this latter case, there are two lines output from combinational logic 188. Many approaches, including different combinations of gates, to detect and generate a phase error signal are possible.

The present invention applies digital delay lock loops (DDLL), analog delay lock loops, (ADLL), and phase lock loops (PLL), to name a few. An example of an embodiment with DDLL is described below.

Figure 4:
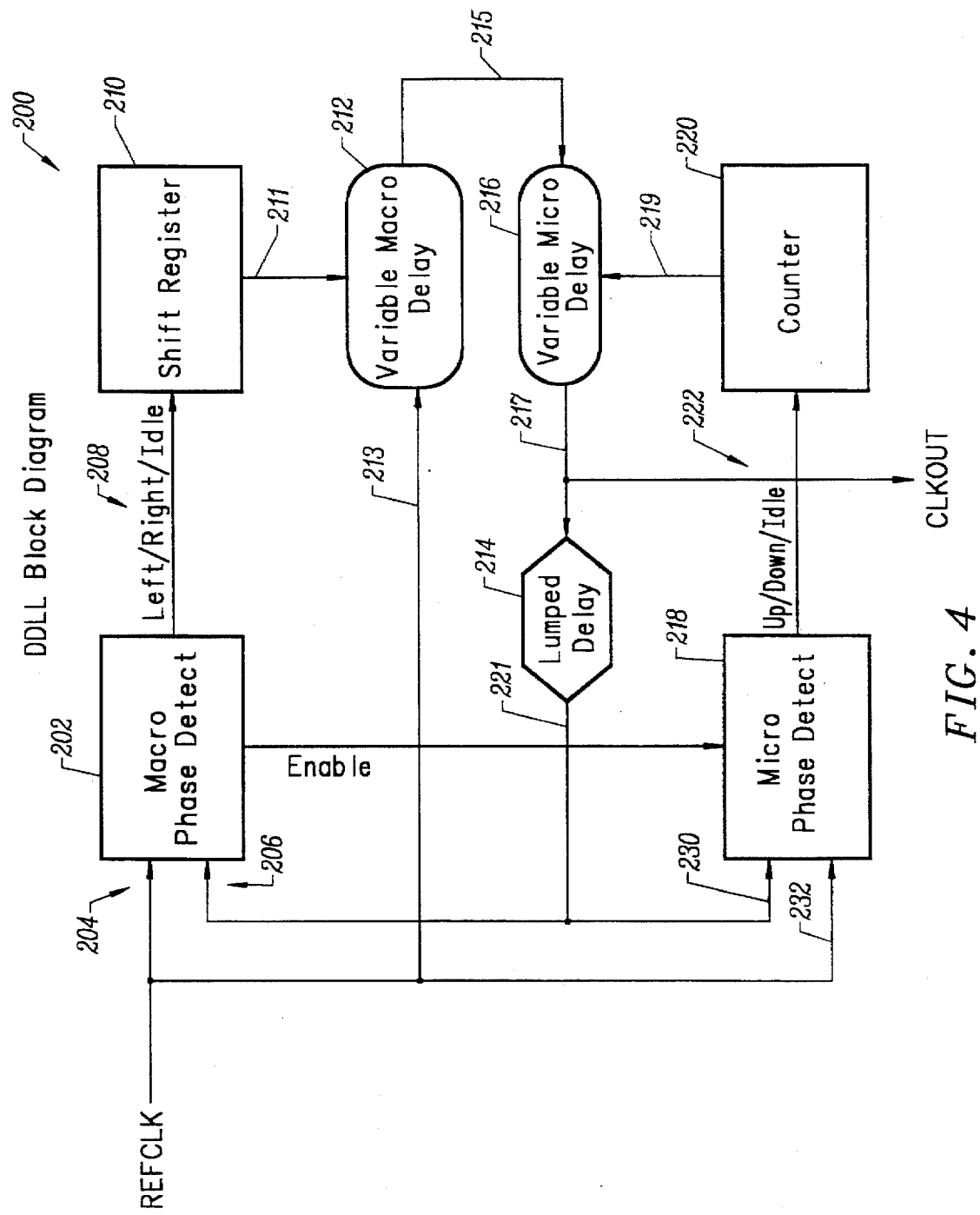
FIG. 4 shows a delay lock loop block diagram using macro and micro phase detectors.

FIG. 4 shows a digital DLL (DDLL) block diagram using macro and micro phase detectors. This circuit functions similarly to the circuits discussed above for a DLL, except that the phase error detection and delay selection is implemented in two separate stages amounting to a coarse and fine adjustment of the delay. Further, the circuit of FIG. 4 uses standard digital parts such as a shift register and a counter to implement the delay selection function, shown as delay chain 118 of FIG. 1D, discussed above. In FIG. 4, block diagram 200 shows macro phase detector 202 having a REF CLK input at 204 and a feedback clock input at 206.

Macro phase detector 202 can be implemented by a circuit similar to that of FIG. 3A discussed above. Macro phase detector 202 outputs a left/right/idle signal 208 to shift register 210. The left/right/idle signal can be one or more lines that indicate to shift register 210 whether the reference clock is leading or lagging the internal clock by at least a fixed time duration called the macro error threshold.

Micro phase detector 218 functions similarly to macro phase detector 202, except that micro detector 218 is sensitive to a smaller fixed time duration, i.e., the micro error threshold, than macro detector 202. In other words, micro phase detector 218 will have a smaller value for d, shown in FIG. 3B, so that micro phase detector 218 can be used to detect smaller phase differences between the internal, or feedback, clock and reference clock. Micro phase detector 218 outputs up/down/idle signal 222 to counter 220.

Figure 8:
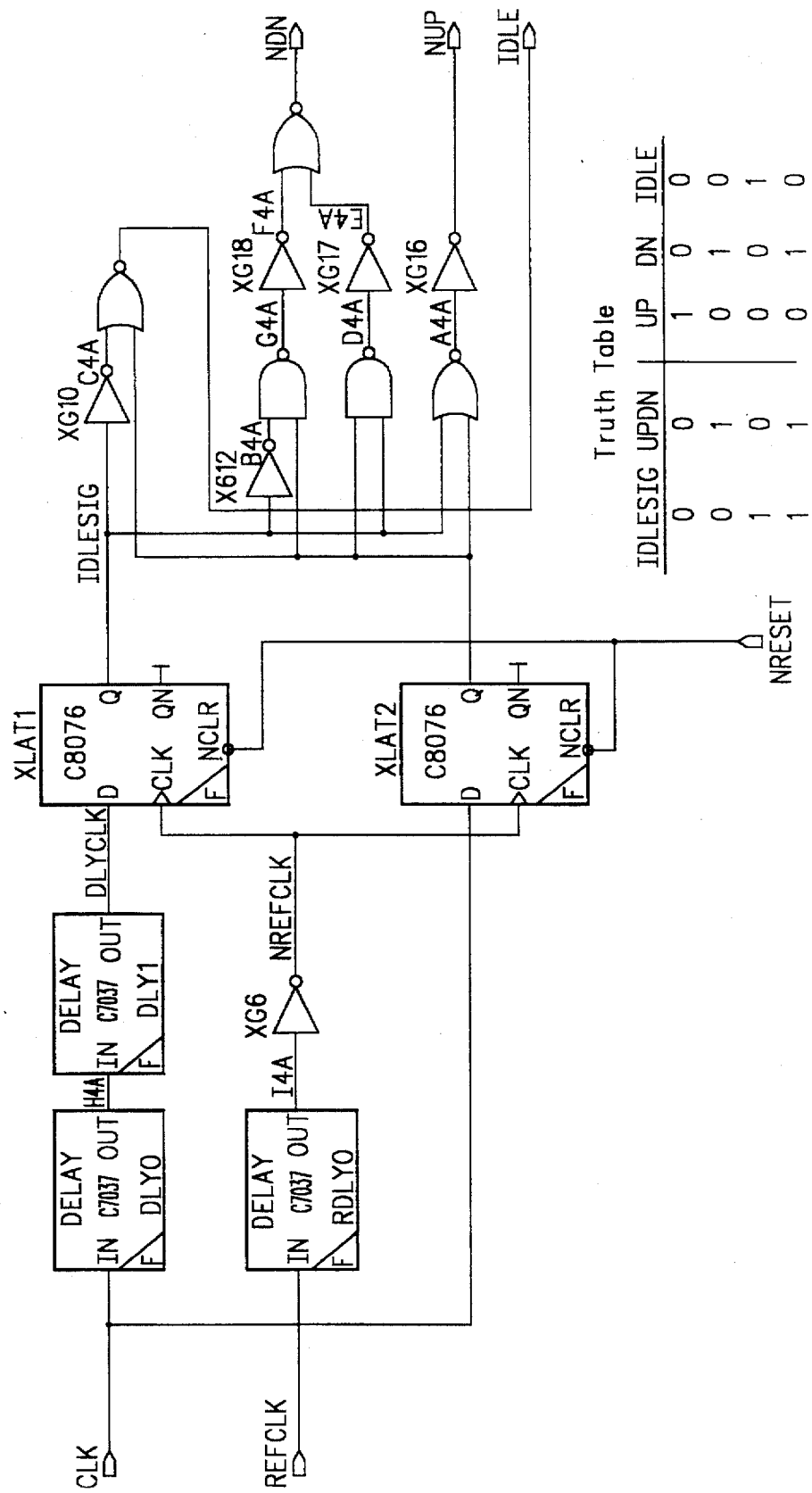
FIG. 8 shows a macro phase error detector circuit.
Figure 9:
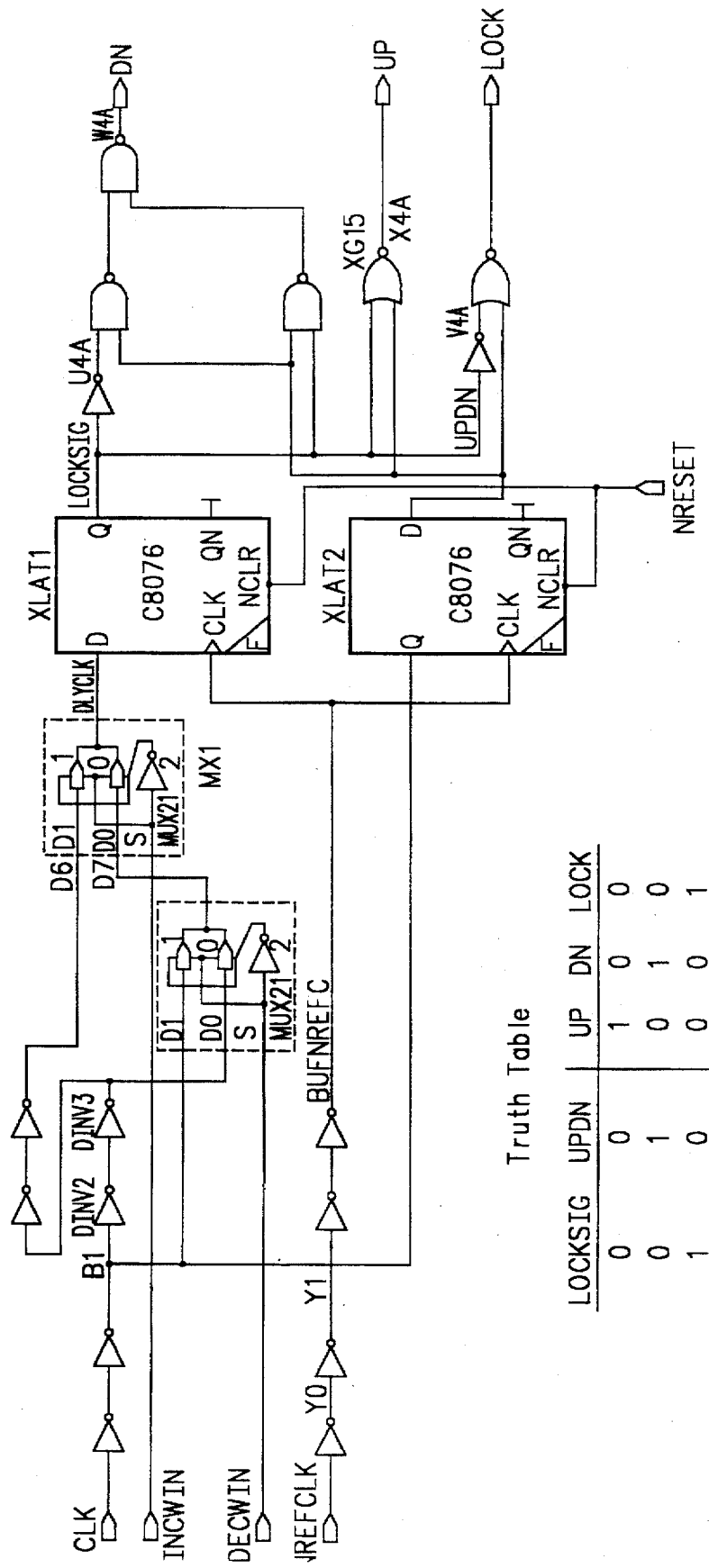
FIG. 9 shows a micro phase error detector circuit.

Examples of a macro phase error detector circuit and a micro phase error detector circuit are shown in FIGS. 8 and 9, respectively. In FIG. 8, signals NDN, NUP and IDLE implement the left/right/idle signal 208 of FIG. 4. The left/right/idle signal is implemented with three signals, NDN, NUP and IDLE for controlling shift register 210. When NUP is active shift register 210 shifts right, when NDN is active shift register 210 shifts left, when IDLE is active no shifting occurs.

The micro phase error detector circuit of FIG. 9 operates similarly to the macro phase error detector circuit of FIG. 8. In FIG. 9, signals DN, UP and LOCK are used to, respectively, increment, decrement and preserve a count in counter 220. The micro phase error detector circuit of FIG. 9 is provided with control signals INCWIN and DECWIN for modifying the delay "window" to make the circuit more or less sensitive to timing differences between the CLK and NREFCLK signals. Signals INCWIN and DECWIN may be controlled by external circuitry, such as other circuitry on the same chip as the delay lock loop circuit.

Shift register 210, along with variable macro delay 212, perform a macro delay selector function to delay the reference clock signal according to the phase error detected by macro phase detector 202. In a preferred embodiment, shift register 210 is preset with a value that is shifted according to the signal 208 from macro phase detector 202. For example, shift register 210 can be preset with a value such as binary 11100 (or 11000; 10000) that is shifted left when macro phase detector 202 indicates that the feedback clock on line 206 is leading the reference clock 204. Likewise, shift register 210 could shift the preset value to the right when macro phase detector 202 indicates that the feedback clock 206 lags the reference clock 204. The shifting left or right of the value of in shift register 210 will, respectively, increase or decrease the value. This value is output to variable macro delay 212 via line 211. Variable macro delay 212 can be, e.g., a multiplexer that selects one of several delay values to apply to the reference clock input to variable macro delay 212 via line 213. The choice of using a counter or shift register devices can be made according to layout considerations and speed of the specific device. The preferred embodiment uses a shift register for the macro delay and a counter for the micro delay.

Once the delay is applied by variable macro delay 212, the delayed reference clock signal is output to variable micro delay 216 via line 215. Variable micro delay 216 and counter 220 form a micro delay selector similar to the macro delay selector described above. Micro phase detector 218 outputs the up/down/idle signal 222 to counter 220. Counter 220 uses the signal 222 to increment or decrement a count value depending on whether the micro phase detector 218 determines that the feedback clock signal on line 230 leads, or lags, respectively, the reference clock signal on line 232. For example, if micro phase detector 218 determines that the feedback clock signal 230 leads the reference clock signal 232, then micro phase detector will output an up signal on signal 222 to direct counter 220 to increment its count value.

The count value is transferred to variable micro delay 216 along line 219. Variable micro delay 216 selects one of several delay values to apply to the delayed reference clock on line 215. This generates a further delayed reference clock signal that is output by variable micro delay 216 onto line 217. Note that CLK OUT signal is obtained from line 217 as the clock signal to be distributed to the various components on the integrated circuit for which the digital delay lock loop (DDLL) of FIG. 4 is acting as the clock distribution circuit. Finally, lumped delay 214 receives the further delayed reference clock signal on line 217, applies a fixed delay, and outputs the feedback clock signal at 221. Lumped delay 214 matches loading seen on the chip.

Figure 5:
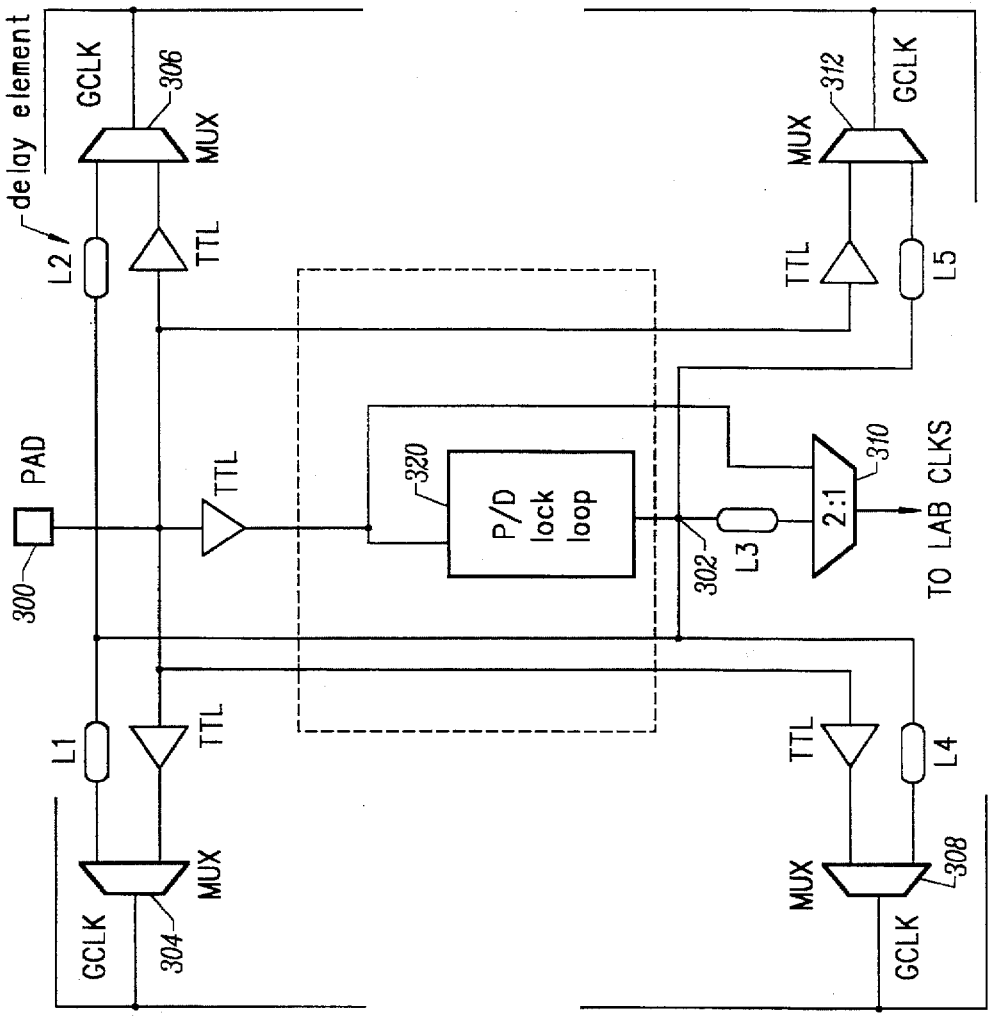
FIG. 5 shows a circuit diagram where synchronized or reference clocks are selectable for distribution to different parts of an integrated circuit.

FIG. 5 shows a circuit diagram where a PLL or DLL (P/DLL) generates a synchronized clock signal 302 from a reference clock signal input at pad 300 and where the synchronized or reference clocks are selectable for distribution to different parts of the integrated circuit on which the P/DLL resides. The advantage to this scheme is that the P/DLL is placed near the pads so that the reference clock is not delayed much before it reaches the P/DLL. For the P/DLL to work properly a very stable reference clock must be provided. If the reference clock is not stable then an external circuit can switch the P/DLL off and the reference clock can be used to directly feed the circuitry on the chip.

The circuit shown in FIG. 5 allows either the synchronized or reference clocks to be distributed to five different areas of an integrated circuit, or chip. The selection of one of the clocks is performed by the five multiplexers shown as MUX 304, 306, 308, 310 and 312. The multiplexers are used to select one of the two clocks via control signals (not shown) which may be driven by, e.g., a register that is loadable under the direction of a micro processor on the chip. Delay elements L1-5 are used to match the delay across the chip. By modifying the amount of delay at each of the elements through line matching, the GCLKs can be brought into close synchronization. The synchronized clock is output by P/DLL circuitry in block 320 and may be, e.g., the DLL circuit discussed above in connection with FIGS. 1-4.

Figure 6:
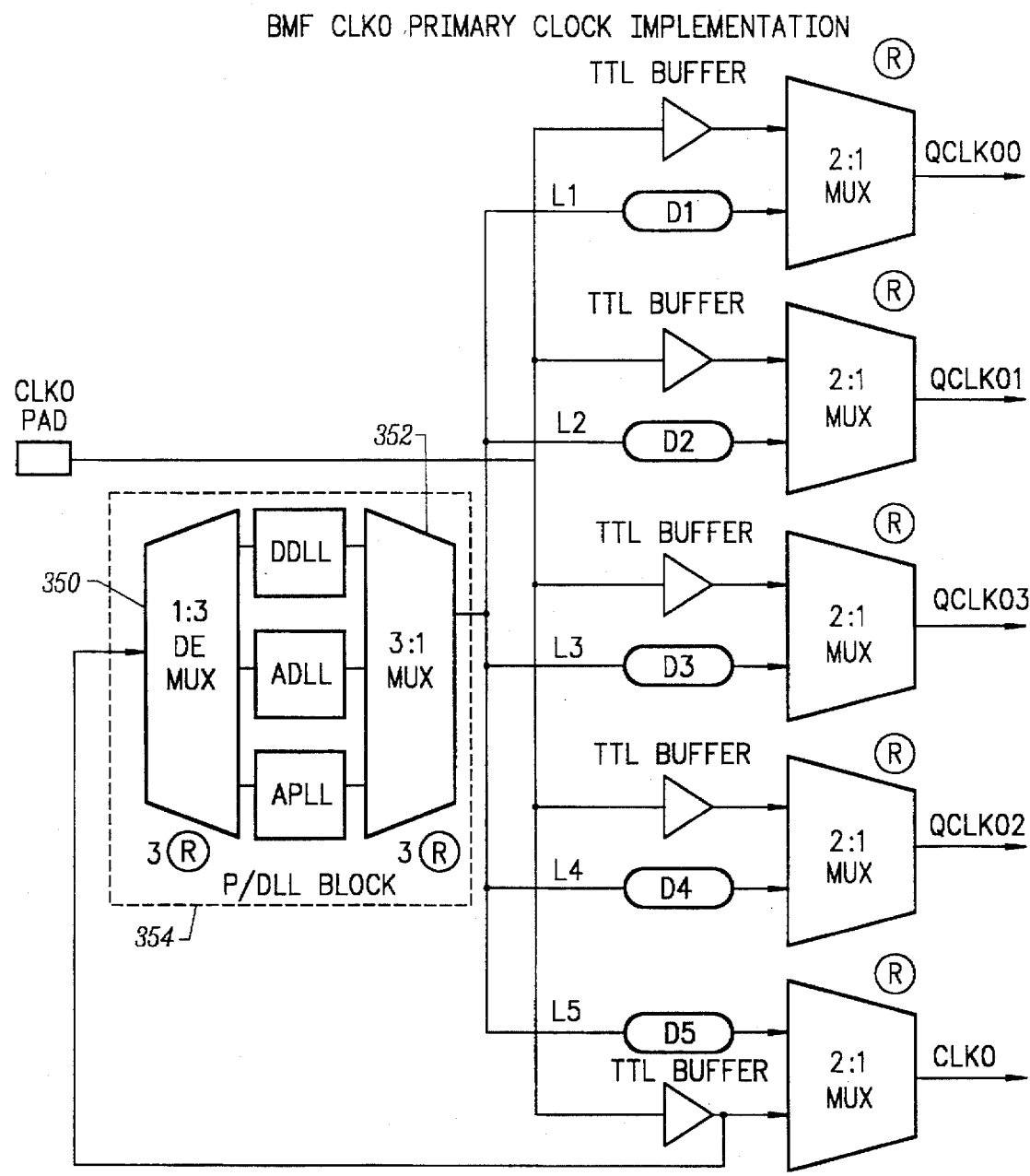
FIG. 6 shows the circuit of FIG. 5 with more detail for one of the functional blocks.

FIG. 6 shows the circuit of FIG. 5 with more detail in P/DLL block 320 of FIG. 5. FIG. 6 shows that any of three synchronization approaches can be selected by using demultiplexer 350 and multiplexer 352 within P/DLL block 354. By using demultiplexer 350 and multiplexer 352, any of the three clock synchronization systems shown as DDLL, ADLL and APLL may be selected. These clock synchronization systems are, respectively, a digital delay lock loop, an analog delay lock loop and an analog phase lock loop. The digital delay lock may be implemented by, e.g., a circuit as shown in FIG. 1D, and may include any of the additional circuit details discussed in FIGS. 2-4. The analog delay lock loop can be implemented with the circuit as shown in FIG. 1D by using an analog design approach as is known in the art. The analog phase lock loop may be implemented with an analog phase lock loop design as is known in the art.

Figure 7:
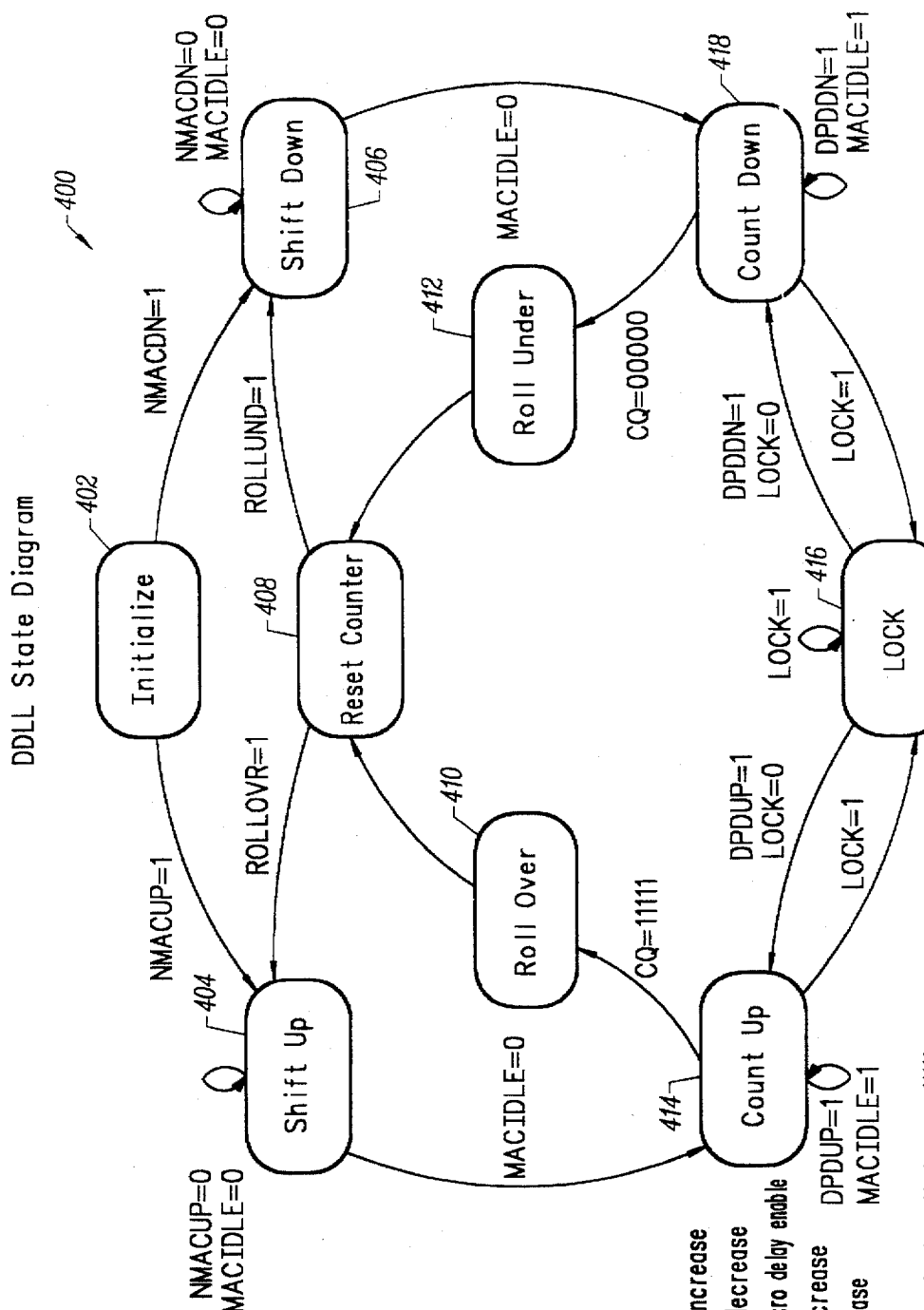
FIG. 7 is a state diagram for the delay lock loop block diagram of FIG. 4.

FIG. 7 is a state diagram 400 for the delay lock loop circuit of FIG. 4. In FIG. 7, at state 402 the circuit of FIG. 4 is initialized. This includes, for example, resetting shift register 210 and counter 220. Also, if the circuit of FIG. 3A is used to perform phase detection then flip-flops FF1 and FF2 may be reset. From state 402 macro phase detector 202 determines whether to shift up or down. State 404 represents the state where the feedback clock is lagging behind the reference clock so that the shift register shifts up. State 406 represents the state where the feedback clock is leading the reference clock so that the shift register shifts down.

State 404 remains the current state for as long as the circuit of FIG. 4 is in a condition where the feedback clock signal lags the reference clock signal by an amount that equals or exceeds a macro error threshold. In the preferred embodiment, the value for the macro error threshold is 1.5 nS while the micro error threshold, or window, is 0.2 nS. As long as there is at least this much delay between the feedback clock signal and the reference clock signal the state remains at state 404 and shift register 210 is shifted up. An analogous operation pertains to state 406 where the shift register is shifted down as long as the feedback clock leads the reference clock by an amount that is greater than the macro error threshold.

Assuming that the phase error between the feedback and reference clocks is no longer greater than the macro error threshold, the state progresses from state 404 to state 414, or from state 406 to state 418. At state 414, the micro phase detector will increment the counter 220 as long as the feedback clock lags the reference clock by at least the micro error threshold amount. Similarly, at state 418 the micro phase detector decrements the counter as long as the feedback clock leads the reference clock by at least the micro error threshold amount. If the counter overflows at state 414 then states 410 and 408 are entered to reset the counter. The counter reset changes the micro delay to approximately match the delay change in the macro delay. If the counter underflows from the decrement operation at state 418 then states 412 and 408 are entered to reset the counter. From state 408, state 404 is entered if the counter has rolled over to perform a macro adjustment to increase the delay to the feedback signal. Similarly, if the counter has rolled under then from state 408 state 406 is entered to perform a macro adjustment to decrease the delay to the feedback signal.

Assuming, from either of states 414 or 418 that the feedback clock attains synchronization with the reference clock, then state 416 is entered to indicate that the feedback and reference clocks are locked together. This occurs when the phase error difference between the two clock signals is less than the micro error threshold. Should the phase error increase beyond the micro error threshold then either state 414 or state 418 is again entered depending on whether the phase error indicates that the feedback clock leads the reference clock or lags the reference clock, respectively.

In the foregoing specification, the invention has been described with reference to a specific exemplary embodiment thereof. It will, however, be evident that various modifications and changes may be made without departing from the broader spirit and scope of the invention as set forth in the appended claims. Many such changes or modifications will be readily apparent to one of ordinary skill in the art. The specification and drawings are, accordingly, to be regarded in an illustrative rather than a restrictive sense, the invention being limited only by the provided claims.

What is claimed is:

1. A digital delay lock loop circuit for outputting a synchronized clock locked to a reference clock signal, the digital delay lock loop circuit comprising:

a reference clock input for receiving the reference clock signal;

a feedback clock signal derived from the reference clock signal;

a first digital phase detector coupled to the reference clock signal and the feedback clock signal, wherein the first digital phase detector determines a first phase difference between the reference clock signal and the feedback clock signal and outputs a first phase error signal at a first phase error signal output;

a second digital phase detector coupled to the reference clock signal and the feedback clock signal, wherein the second digital phase detector determines a second phase difference between the reference clock signal and the feedback clock signal and outputs a second phase error signal at a second phase error signal output, wherein the second phase error signal is coupled to delay the feedback clock signal in response to the second phase error signal;

a delay selector coupled to the first phase error signal and the reference clock signal for applying a delay to the reference clock signal in response to the first phase error signal, wherein the delay selector outputs a delayed reference clock signal as the feedback clock signal; and wherein the synchronized clock output is coupled to the feedback clock signal.

2. The digital delay lock loop circuit of claim 1, further comprising:

wherein the first phase error signal indicates when the feedback clock signal leads the reference clock signal, and wherein the first phase error signal indicates when the feedback clock signal lags the reference clock signal;

wherein the delay selector includes a shift register for shifting a value in a first direction when the first phase error signal indicates that the feedback clock signal leads the reference clock signal, and wherein the shift register shifts the value in a second direction when the first phase error signal indicates that the feedback clock signal lags the reference clock signal, wherein the shift register outputs the value on one or more output lines; and a delay multiplexer coupled to the reference clock signal and the one or more output lines of the shift register, for applying one of a plurality of delay elements to the reference clock signal and outputting the resulting delayed signal as a delayed reference clock signal.

3. A digital delay lock loop circuit for outputting a synchronized clock locked to a reference clock signal, the digital delay lock loop circuit comprising:

a reference clock input for receiving the reference clock signal;

a macro phase detector coupled to the reference clock signal and a delayed feedback signal, wherein the macro phase detector outputs a macro phase error signal indicating the phase difference between the reference clock signal and the delayed feedback signal, wherein the macro phase error signal indicates phase differences of at least a first amount;

a micro phase detector coupled to the reference clock signal and the delayed feedback signal, wherein the micro phase detector outputs a micro phase error signal indicating the phase difference between the reference clock signal and the delayed feedback signal, wherein the micro phase error signal indicates phase differences of at least a second amount wherein the second amount is smaller than the first amount;

a macro delay selector responsive to the macro phase error signal for outputting a delayed reference clock signal;

a micro delay selector coupled to the output of the macro delay selector, wherein in response to the micro phase error signal, the micro delay selector outputs a further delayed reference clock signal; and wherein the synchronized clock signal and said delayed feedback signal are the further delayed reference clock signal.

4. The digital delay lock loop circuit of claim 3, further comprising:

wherein the macro phase error signal indicates when the delayed feedback signal leads the reference clock signal by at least the first amount, and wherein the macro phase error signal indicates when the delayed feedback signal lags the reference clock signal by at least the first amount;

wherein the macro delay selector includes a shift register coupled to the macro phase error signal so that a value in the shift register is shifted in response to the indication of the macro phase error signal, wherein the shift register outputs the value;

a variable macro delay coupled to the reference clock signal, wherein the variable macro delay applies a delay to the reference clock signal according to the value from the shift register to generate the delayed reference clock signal;

wherein the micro phase error signal indicates when the delayed feedback signal leads the reference clock signal by at least the second amount, and wherein the micro phase error signal indicates when the delayed feedback signal lags the reference clock signal by at least the second amount;

wherein the micro delay selector includes a counter coupled to the micro phase error signal so that a count in the counter is changed in response to the indication of the micro phase error signal; and a variable micro delay coupled to the delayed reference clock signal, wherein the variable micro delay applies a delay to the delayed reference clock signal according to the count from the counter to generate the further delayed reference clock signal.

5. A digital delay lock loop circuit for outputting a synchronized clock locked to a reference clock signal, the digital delay lock loop circuit comprising:

a reference clock input for receiving the reference clock signal;

a feedback clock signal derived from the reference clock signal;

a first digital phase detector coupled to the reference clock signal and the feedback clock signal, wherein the first digital phase detector determines a first phase difference between the reference clock signal and the feedback clock signal and outputs a first phase error signal at a first phase error signal output;

a second digital phase detector coupled to the reference clock signal and the feedback clock signal, wherein the second digital phase detector determines a second phase difference between the reference clock signal and the feedback clock signal and outputs a second phase error signal at a second phase error signal output, wherein the second phase error signal is coupled to delay the feedback clock signal in response to the second phase error signal;

a delay selector coupled to the first phase error signal and the reference clock signal for applying a delay to the reference clock signal in response to the first phase error signal, wherein the delay selector outputs a delayed reference clock signal as the feedback clock signal, wherein the synchronized clock output is coupled to the feedback clock signal, and a plurality of programmable delay elements, through which the synchronized clock is distributed to components of an integrated circuit, each programmable delay element is programmed to provide a uniform delay for the synchronized clock throughout the integrated circuit.

6. A digital delay lock loop comprising:

a reference clock input, receiving a reference clock signal;

a feedback clock signal derived from the reference clock signal;

a first phase detector coupled to detect a first phase difference between the reference clock signal and the feedback clock signal;

a second phase detector coupled to detect a second phase difference between the reference clock signal and the feedback clock signal, wherein the second phase detector detects a phase difference of an amount smaller than the first phase detector;

a first delay selector, delaying the reference clock based on the first phase difference from the first phase detector, and generating a first delayed reference clock signal; and a second delay selector, delaying the first delayed reference clock based on the second phase difference from the second phase detector, and generating a second delayed reference clock, wherein the second delayed reference clock is coupled to the feedback clock signal, whereby the second delayed reference clock is synchronized with the reference clock signal.

\* \* \* \* \*